(12) United States Patent
Kim et al.

(10) Patent No.: US 6,168,979 B1
(45) Date of Patent: Jan. 2, 2001

(54) METHOD FOR FABRICATING SEMICONDUCTOR DEVICE

(75) Inventors: Hyung Ki Kim, Inch'on; Jong Wook Lee, Kyoungki-do, both of (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/348,572

(22) Filed: Jul. 7, 1999

(30) Foreign Application Priority Data

Aug. 27, 1998 (KR) .................................................. 98-35024

(51) Int. Cl.[7] .................................................. H01L 29/72
(52) U.S. Cl. .......................... 438/151; 438/213; 438/279; 438/300; 438/585; 257/347; 257/401; 257/412
(58) Field of Search .................................... 438/151, 213, 438/279, 300, 585

(56) References Cited

U.S. PATENT DOCUMENTS

| | | | |
|---|---|---|---|
| 4,949,154 | 8/1990 | Haken | 357/54 |
| 5,349,228 | 9/1994 | Neudeck et al. | 257/365 |
| 5,446,299 | 8/1995 | Acovic et al. | 257/316 |
| 5,780,327 * | 7/1998 | Chu et al. | 438/156 |

* cited by examiner

Primary Examiner—Edward Wojciechowicz
(74) Attorney, Agent, or Firm—Ladas & Parry

(57) ABSTRACT

Disclosed is a semiconductor device having low voltage characteristic and advantageous integrity simultaneously. The semiconductor device comprises a silicon-on-insulator (SOI) substrate of a stack structure comprising a base layer as a means for supporting, a buried oxide layer, and a semiconductor layer providing an active region; and a first transistor and a second transistor formed on the active region of the SOI substrate, wherein the first and second transistors are formed as a stack structure on one active region and they share one gate electrode, a drain region of the second transistor is electrically connected to the gate electrode and a source region of the second transistor is electrically connected to the active region.

7 Claims, 7 Drawing Sheets

METHOD FOR FABRICATING SEMICONDUCTOR DEVICE

BACKGROUND OF THE INVENTION

1. Field of the Invention

The present invention relates to a semiconductor device, and more particularly to a semiconductor device having low voltage characteristic and advantageous integrity, and method for fabricating the same.

2. Description of the Related Art

Due to the fast development in semiconductor device industry such as high integration, fast speed and low voltage, a semiconductor device using the SOI substrate instead of a silicon substrate made of bulk silicon, has been proposed. The SOI substrate has a stack structure comprising a base layer as a means for supporting, a buried oxide layer disposed on the base layer, and a semiconductor layer disposed on the buried oxide layer and providing an active region.

Compared to general semiconductor device integrated on a silicon substrate, the semiconductor device integrated on the SOI substrate (hereinafter "SOI device") has advantages such as a high speed due to lower junction capacitance, and a reduction in driving voltage due to lower threshold voltage and latch-up prevention due to the complete isolation.

In the meantime, as the demand of portable electric products increases, it is required a reduction not only in the device size but also in the voltage supplied thereto. Currently, a method for lowering the threshold voltage of the transistor is frequently used so as to obtain the low-voltage device. There have been suggested those method for lowering the threshold voltage such as a structure in which two transistors are provided at one device. Herein, those two transistors consist of a main transistor and an auxiliary transistor being connected to the main transistor.

When the low-voltage device is embodied on the silicon substrate with above described structure, there is however occurred limitations such as an increase in the leakage current simultaneously although the threshold voltage is reduced. On the other hand, when the low-voltage device is embodied on the SOI substrate, since the SOI device has basically characteristics of low threshold voltage and low leakage current, the SOI device is probably suitable for manufacturing process of the portable electronics products requiring small size and low voltage rather than the semiconductor device embodied on the silicon substrate.

However, the low-voltage device having two transistors as above also incurs limitation in view of integrity since active regions for the respective transistors should be provided.

SUMMARY OF THE INVENTION

Accordingly, it is one object of the present invention to provide a semiconductor device having low voltage characteristic and advantageous integrity.

Further, it is another embodiment of the present invention to provides a method for fabricating said semiconductor device.

To accomplish foregoing objects, the present invention provides a semiconductor device comprising: a silicon-on-insulator (SOI) substrate of a stack structure comprising a base layer as a means for supporting, a buried oxide layer, and a semiconductor layer providing an active region; and a first transistor and a second transistor formed on the active region of the SOI substrate, wherein the first and second transistors are formed as a stack structure on one active region and they share one gate electrode, a drain region of the second transistor is electrically connected to the gate electrode and a source region of the second transistor is electrically connected to the active region.

The present invention further provides a semiconductor device comprising: an SOI substrate of a stack structure comprising a base layer as a means for supporting, a buried oxide layer, and a semiconductor layer providing an active region; a first transistor formed on the active region of the semiconductor layer, and comprising a gate electrode having a first gate oxide layer, source and drain regions formed in the semiconductor layer at both sides of the gate electrode respectively; a second transistor sharing the gate electrode with the first transistor, and comprising a second gate oxide layer formed on the gate electrode, source and drain regions formed on the second gate oxide layer; an intermediate insulating layer formed on the SOI substrate to cover the first and second transistors; source and drain electrodes being contacted with the source and drain regions of the first transistor respectively; a first metal wiring for electrically connecting the gate electrode and the drain region of the second transistor; and a second metal wiring for electrically connecting the active region of the first transistor and the source region of the second transistor.

The present invention provides a method for fabricating a semiconductor device comprising the steps of: providing an SOI substrate of a stack structure comprising a base layer as a means for supporting, a buried oxide layer, and a semiconductor layer providing an active region; forming a first oxide layer, a first conduction layer, a second oxide layer and a second conduction layer on the semiconductor layer successively; forming a conduction layer pattern, a second gate oxide layer, a gate electrode and a first gate oxide layer on the active region of the semiconductor layer by patterning the first oxide layer, the first conduction layer, the second oxide layer and the second conduction layer; forming first source and drain regions in the semiconductor layer at both sides of the gate electrode, and second source and drain regions at both ends of the conduction layer pattern, wherein a first transistor comprises the gate electrode, the first source and drain regions, and a second transistor comprises the gate electrode, the second source and drain regions; forming an intermediate insulating layer on a resultant; etching-back the intermediate insulating layer until the second source and drain regions of the second transistor are exposed; forming a first contact hole and a second contact hole exposing the first source and drain regions of the first transistor respectively, and a third contact hole and a fourth contact hole exposing the gate electrode and the active region respectively by selectively etching selected portions of the intermediate insulating layer; forming a metal layer on the intermediate insulating layer with a sufficient thickness to fill the first, second, third and fourth contact holes entirely; and forming source and drain electrodes being contacted with the first source and drain regions of the first transistor through the first and second contact holes respectively, a first metal wiring for electrically connecting the gate electrode and the drain region of the second transistor through the third contact hole, and a second metal wiring for electrically connecting the active region and the second source region of the second transistor through the fourth contact hole on the intermediate insulating layer by patterning the metal layer.

BRIEF DESCRIPTION OF THE DRAWINGS

The object, spirit and advantages of the present invention will be readily understood by the accompanying drawings and detailed descriptions.

DETAILED DESCRIPTION OF THE INVENTION

Hereinafter, preferred embodiment of the present invention will be described in detail with reference to accompanying drawings.

Figure 1:
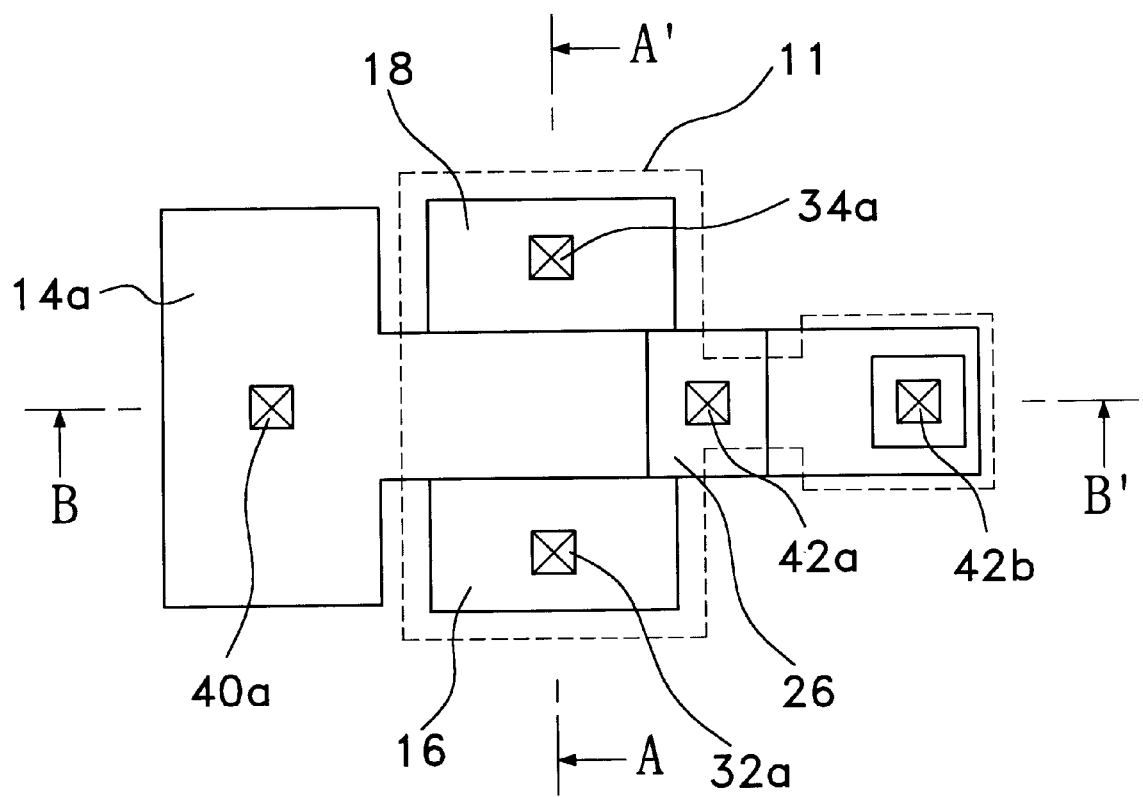
FIG. 1 is a layout of a semiconductor device according to the embodiment of the present invention.

FIG. 1 is a layout of a semiconductor device according to the embodiment of the present invention. The reference numeral 11 stands for an active region, 14a for gate electrodes being shared by first and second transistors, 16 and 18 for a source region and a drain region of the first transistor respectively, 26 for a source region of the second transistor, 32a and 34a for a contact of the source and drain regions of the first transistor respectively, 40a for a contact of the gate electrode, 42a for a contact of the source region of the second transistor and 42b for a contact of the active region.

As shown in the drawing, the semiconductor device of this invention comprises first and second transistors stacked on one active region 11. The first and second transistors share one gate electrode 14a, and especially the gate electrode 14a is arranged perpendicular to the source and drain regions 16,18 of the first transistor.

Figure 2:
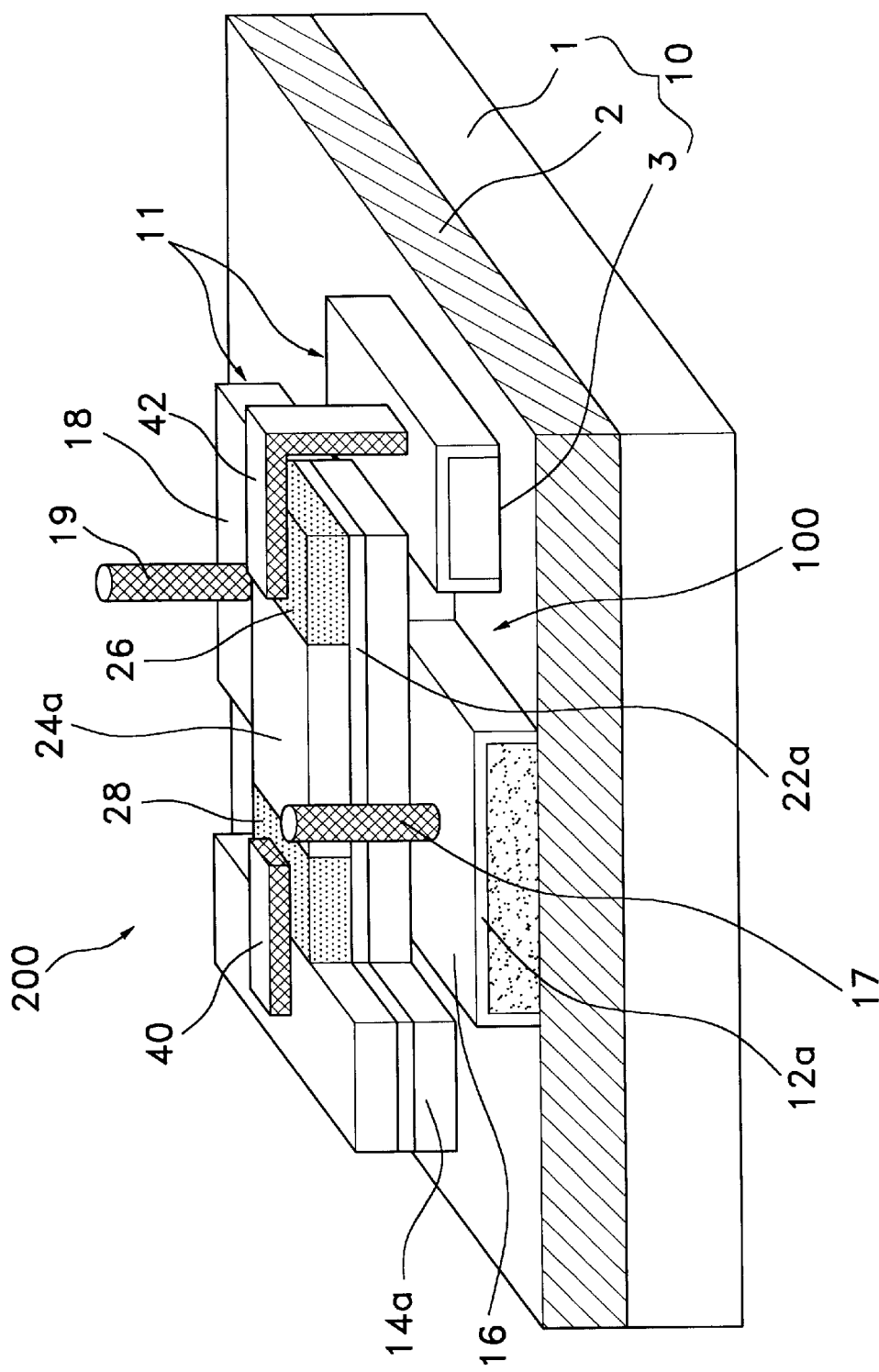
FIG. 2 is a perspective view showing the semiconductor device according to the embodiment of the present invention.

FIG. 2 is a perspective view showing a semiconductor device according to the embodiment of the present invention. As shown in the drawing, the semiconductor device of the present invention has an SOI substrate 10 of stack structure comprising a base layer 1 as a means for supporting, a buried oxide layer 2 and a semiconductor layer 3 providing an active region, and a first transistor 100 and a second transistor 200 formed on the active region 11 of the semiconductor layer 3. Herein, the active region 11 of the semiconductor layer 3 is defined by a field oxide film(not shown).

The first transistor 100 and the second transistor 200 are formed as a stack structure on one active region 11. The first transistor 100 and the second transistor 200 share one gate electrode 14a. The first transistor 100 is constituted by including a gate electrode 14a, a first gate oxide layer 12a formed in a lower portion of the gate electrode 14a, a first source region 16 and drain region 18 formed within regions of the semiconductor layer 3 in both sides of the gate electrode 14a. The second transistor 200 is constituted by including the gate electrode 14a, a second gate oxide layer 22a formed on the gate electrode 14a and the second source region 26 and drain region 28 formed on the second gate oxide layer 22a.

The source electrode 17 and the drain electrode 19 are contacted with the first source region 16 and the drain region 18 of the first transistor 100 respectively. A first metal wiring 40 is formed such that the gate electrode 14a being shared by the first and second transistors 100,200 is electrically connected to the drain region 28 of the second transistor 200. A second metal wiring 42 is formed such that the active region 11 is electrically connected to the source region 26 of the second transistor 200.

Figure 3:
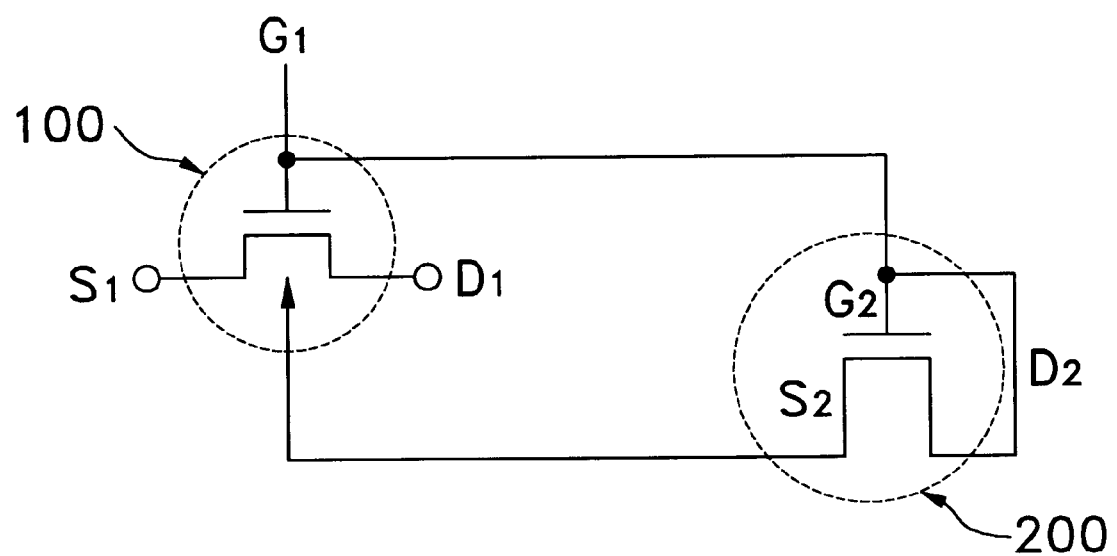
FIG. 3 is a circuit diagram of the semiconductor device according to the embodiment of the present invention.

FIG. 3 is a circuit diagram of the semiconductor device according to the present invention. As shown in the drawing, the semiconductor device of the present invention comprises a first transistor 100 as a main transistor, a second transistor 200 as an auxiliary transistor. Gate electrodes G1,G2 of the first transistor 100 and the second transistor 200 are connected each other. Also, a drain region D2 of the second transistor 200 is connected with the gate electrode G2. Accordingly, an equal voltage is applied to the gate electrode G1 of the first transistor 100, the gate electrode G2 and the drain electrode D2 of the second transistor 200. Furthermore, a source electrode S2 of the second transistor 200 is contacted with a body of the first transistor 100.

In the semiconductor device of the present invention as described above, the body charge in the channel region of the main transistor, i.e. the first transistor 100 is reduced by a positive bias of the auxiliary transistor, i.e. the second transistor 200. Herein, the reduction in the body charge signifies a reduction of voltage that is applied to the gate electrode to generate a channel region on a surface of the active region. Accordingly, the threshold voltage of the first transistor 100 as a main transistor is reduced.

Further, in the semiconductor device of the present invention, the positive bias applied to the body of the first transistor 100 by the second transistor 200, reduces an electric field that should be applied to the gate electrode G1 of the first transistor, compared to the general transistor structure. Therefore, a mobility in the first transistor 100 increases.

Moreover, the semiconductor device of this invention has less leakage current compared to the general transistor structure since the positive bias is not applied to the body of the first transistor 100 before the second transistor 200 is turned on.

Accordingly, the semiconductor device according to the present invention has low threshold voltage and low leakage current characteristics. Especially, the semiconductor device of the present invention has superior integrity property to the property of conventional devices since two transistors are formed in one active region.

Figure 7:
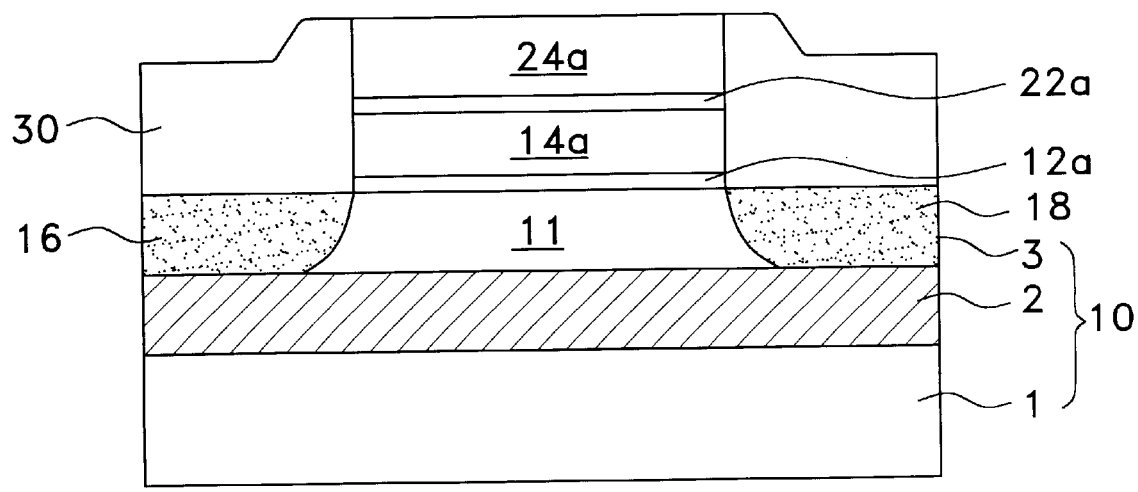
Figure 8:
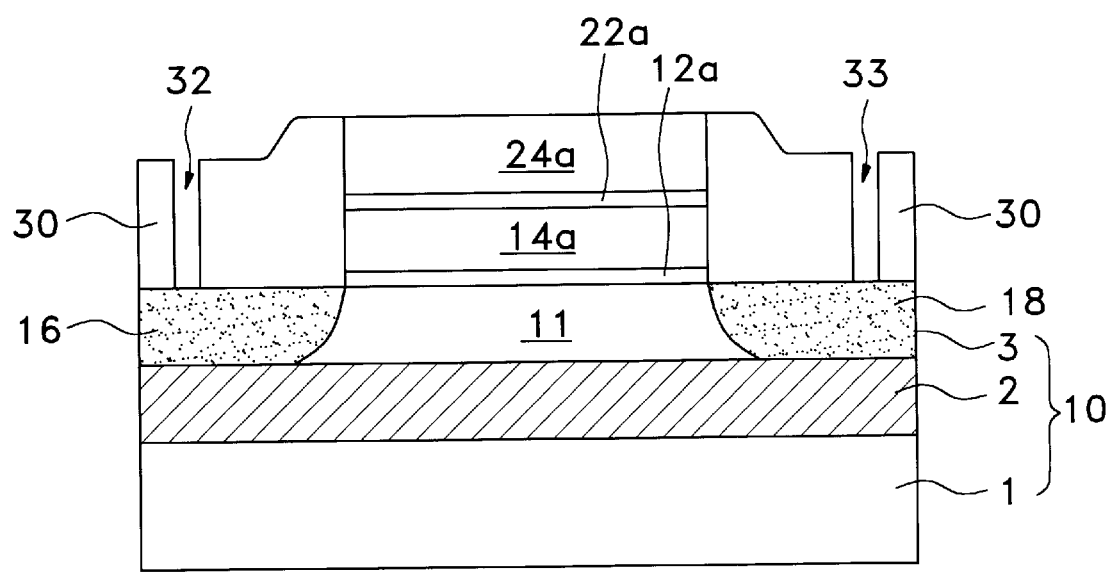
Figure 9:
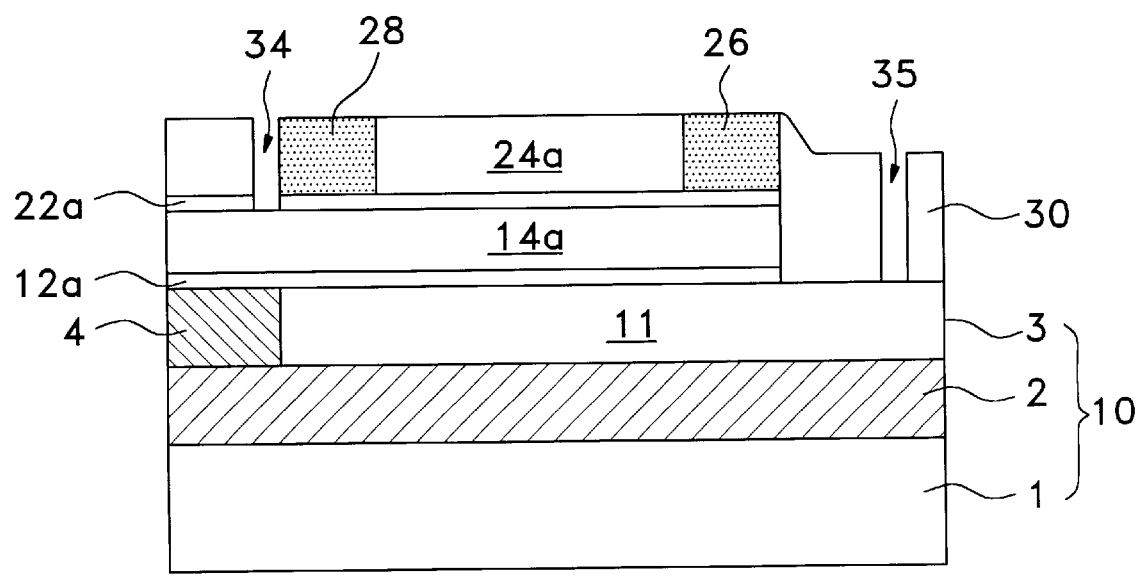
Figure 10:
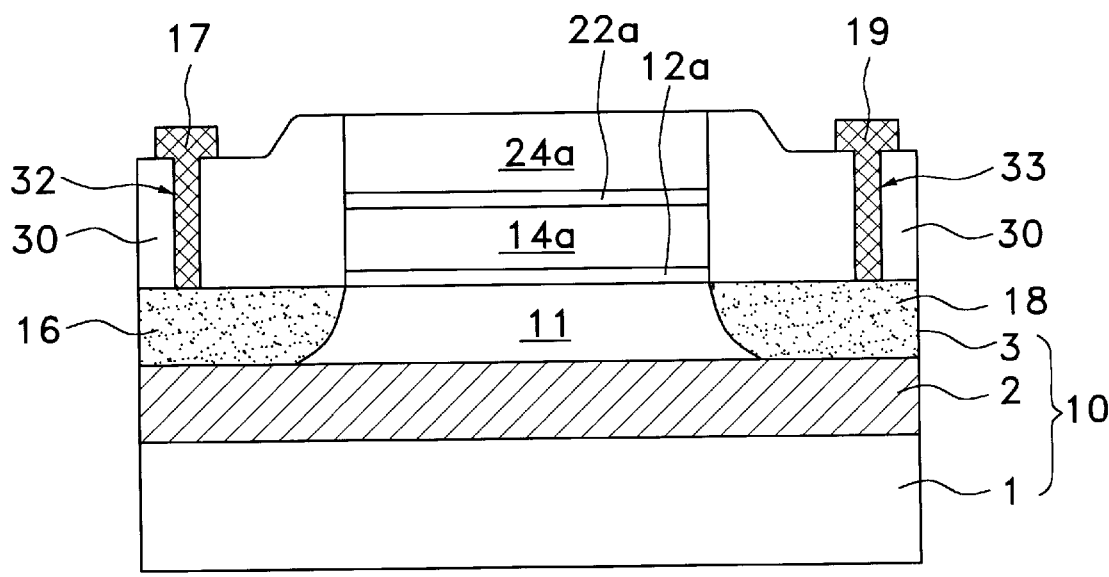
Figure 11:
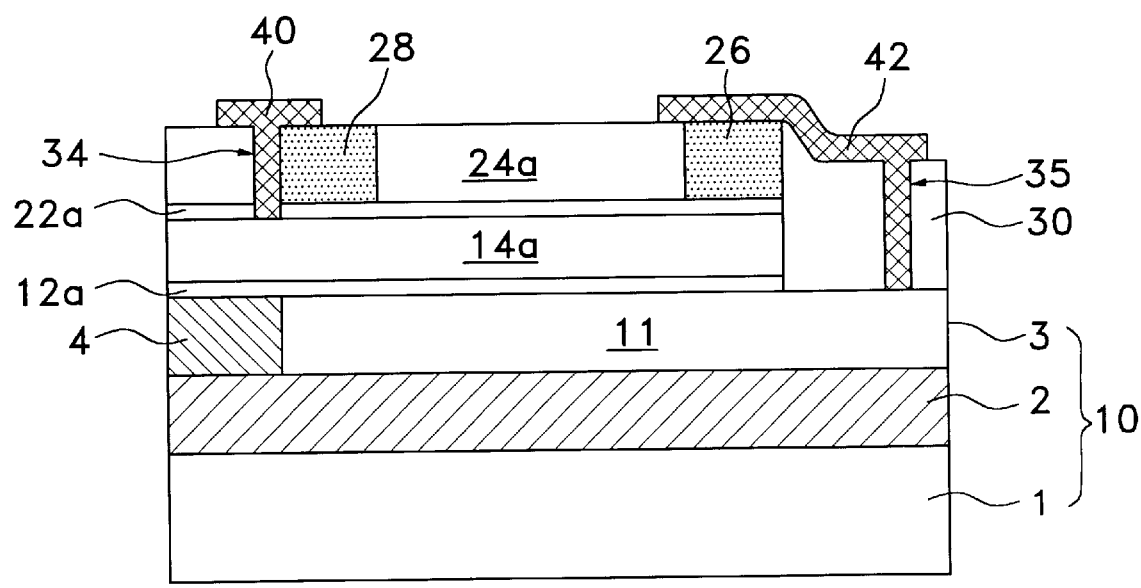

FIGS. 4 to 11 are cross-sectional views showing the fabricating process according to the embodiment of the present invention. Herein, FIGS. 4 to 8 and FIG. 10 are cross-sectional views taken along the line A—A' of FIG. 1, and FIGS. 9 and 11 are cross-sectional views taken along the line B—B' of FIG. 1 according to fabricating steps shown in FIGS. 8 and 10.

Figure 4:
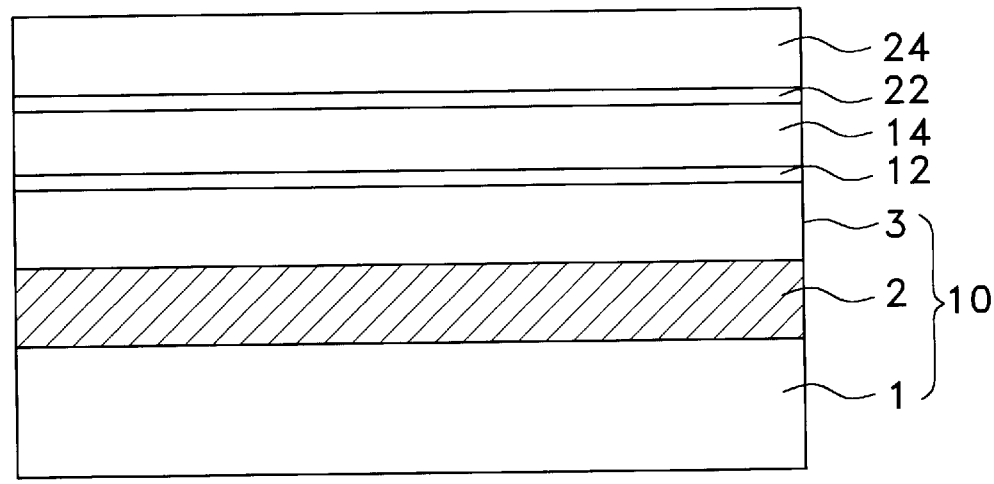
FIGS. 4 to 11 are cross-sectional views showing the fabricating process according to the embodiment of the present invention.

Referring to FIG. 4, there is provided an SOI substrate 10 of a stack structure comprising a base layer 1 as a means for supporting, a buried oxide layer 2 and a semiconductor layer 3 providing an active region. A field oxide film(not shown) defining its active region, is formed in the semiconductor layer 3. A first oxide layer 12, a first conduction layer 14, a second oxide layer 22 and a second conduction layer 24 are formed on the semiconductor layer 3 of the SOI substrate 10 successively. The first conduction layer 14 is a layer that becomes a gate electrode being shared by the first and second transistors, and the first conduction layer 14 is made of doped polysilicon layer. The second conduction layer is a layer in which a source region, a drain region and a channel region of the second transistor 200 are formed later, and is made of undoped polysilicon layer.

Figure 5:
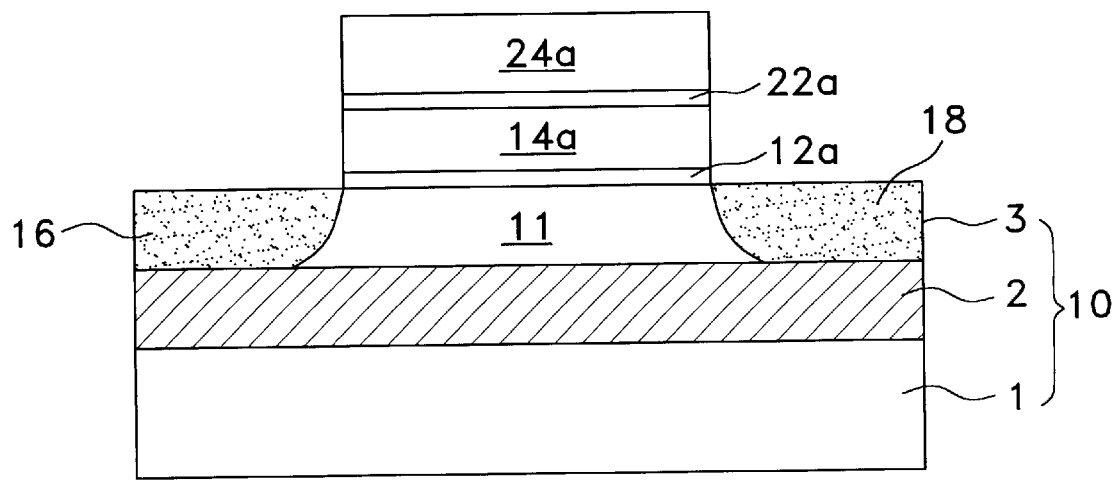

Referring to FIG. 5, the second conduction layer, the second oxide layer, the first conduction layer and the first oxide layer is patterned thereby obtaining a conduction layer pattern 24a in which a source region, a drain region and a channel region are formed later, a gate oxide layer 22a of the second transistor, a gate electrode 14a being shared by the first and second transistors and a gate oxide layer 12a of the first transistor.

Next, an impurity of selected conductivity type, for example, N-type impurity is ion-implanted with high concentration into the semiconductor layer region of both sides of the gate electrode 14a and into both ends of the conduction pattern 24a respectively. Next, the N-type impurity-implanted resultant is annealed thereby forming a first source region 16 and a drain region 18 of the first transistor, and a second source region and drain region(not shown) of the second transistor. Herein, the conduction pattern 24a signifies a channel region disposed between the second source region and the drain region of the second transistor. Accordingly, hereinafter the reference numeral 24a stands for the channel region of the second transistor.

Figure 6:
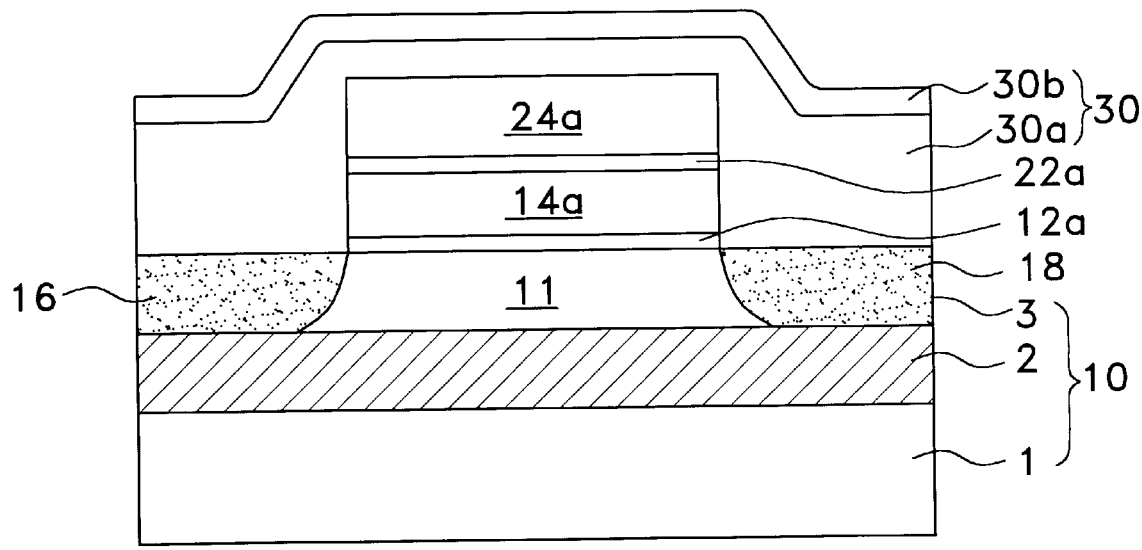

Referring to FIG. 6, an intermediate insulating layer 30 is coated on the resultant. The intermediate insulating layer 30 has a two-story structure comprising of a TEOS oxide layer 30a and a BPSG layer 30b. The BPSG layer 30b is coated, and then is flowed at temperature range of 600~800° C. so that a surface planarization may be obtained.

Referring to FIG. 7, the intermediate insulating layer 30 is etched-back until the channel region 24a including the second source region and the drain region(not shown) of the second transistor is exposed.

Referring to FIGS. 8 and 9, selected portion of the intermediate insulating layer 30 is selectively etched according to a forming process of a photosensitive layer pattern on the intermediate insulating layer 30 and an etching process using the photosensitive layer pattern as an etching barrier. As a result, as shown in FIG. 8, a first contact hole 32 and a second contact hole 33 for respectively exposing the source and drain regions 16,18 of the first transistor, are formed in the intermediate insulating layer 30, and as shown in FIG. 9, there are also formed a third contact hole 34 for exposing the gate electrode 14a and a fourth contact hole 35 for exposing the active region 11 of the semiconductor layer 3 in the intermediate insulating layer 30.

In FIG. 9, the reference numeral 4 stands for a field oxide film defining a active region, 26 and 28 for the second source and drain regions of the second transistor that is formed in the step of FIG. 5.

Referring to FIGS. 10 to 11, a metal layer is coated with a sufficient thickness such that the first to fourth contact holes 32,33,34,35 are filled entirely. Afterward, the metal layer is patterned in a predetermined configuration. Therefore, as shown in FIG. 10, a source region 17 and a drain electrode 19 being contacted with the source and drain regions of the first transistor respectively, are formed on the intermediate insulating layer 30. Also, as shown in FIG. 11, on the intermediate insulating layer 30, a first metal wiring 40 is formed such that the gate electrode 14a being shared by the first and second transistors is electrically connected to the drain region 28 of the second transistor and a second metal wiring 42 is formed such that the active region 11 of the semiconductor layer 3 is electrically connected to the source region 26 of the second transistor 200.

As discussed above, the semiconductor device of the present invention is advantageous in view of the integrity since two transistors are formed in one active region. Further, the semiconductor device is probably suitable for manufacturing process of the portable electric products requiring small size and low voltage since the semiconductor device has the low threshold voltage and low leakage current characteristics.

Various other modifications will be apparent to and can be readily made by those skilled in the art without departing from the scope and spirit of the present invention.

What is claimed is:

1. A method for manufacturing semiconductor device comprising the steps of:
   providing an SOI substrate of a stack structure comprising a base layer as a means for supporting, a buried oxide layer, and a semiconductor layer providing an active region;
   forming a first oxide layer, a first conduction layer, a second oxide layer and a second conduction layer on the semiconductor layer successively;
   forming a conduction layer pattern, a second gate oxide layer, a gate electrode and a first gate oxide layer on the active region of the semiconductor layer by patterning the first oxide layer, the first conduction layer, the second oxide layer and the second conduction layer;
   forming first source and drain regions in the semiconductor layer at both sides of the gate electrode, and second source and drain regions at both ends of the conduction layer pattern, wherein a first transistor comprises the gate electrode, the first source and drain regions, and a second transistor comprises the gate electrode, the second source and drain regions;
   forming an intermediate insulating layer on a resultant;
   etching-back the intermediate insulating layer until the second source and drain regions of the second transistor are exposed;
   forming a first contact hole and a second contact hole exposing the first source and drain regions of the first transistor respectively, and a third contact hole and a fourth contact hole exposing the gate electrode and the active region respectively by selectively etching selected portions of the intermediate insulating layer;
   forming a metal layer on the intermediate insulating layer with a sufficient thickness to fill the first, second, third and fourth contact holes entirely; and
   forming source and drain electrodes being contacted with the first source and drain regions of the first transistor through the first and second contact holes respectively, a first metal wiring for electrically connecting the gate electrode and the drain region of the second transistor through the third contact hole, and a second metal wiring for electrically connecting the active region and the second source region of the second transistor through the fourth contact hole on the intermediate insulating layer by patterning the metal layer.

2. The method of claim 1, wherein the first conduction layer is a doped polysilicon layer.

3. The method of claim 1, wherein the second conduction layer is an undoped polysilicon layer.

4. The method of claim 1, wherein the gate electrode is disposed perpendicular to the source and drain regions of the first transistor.

5. The method of claim 1, wherein the intermediate insulating layer is a two-story structure.

6. The method of claim 5, wherein a first intermediate insulating layer is made of a TEOS(tetra ethyl orthosilicate) oxide layer and a second intermediate insulating layer is made of a BPSG(borophosphosilicate glass) layer.

7. The method of claim 6, wherein the BPSG layer is flowed at temperature range of 600~800° C. after the BPSG layer is formed.

* * * * *